(12) United States Patent
Sager

(10) Patent No.: US 6,172,933 B1
(45) Date of Patent: Jan. 9, 2001

(54) REDUNDANT FORM ADDRESS DECODER FOR MEMORY SYSTEM

(75) Inventor: David J. Sager, Portland, OR (US)

(73) Assignee: Intel Corporation, Santa Clara, CA (US)

( * ) Notice: Under 35 U.S.C. 154(b), the term of this patent shall be extended for 0 days.

(21) Appl. No.: 09/148,314

(22) Filed: Sep. 4, 1998

(51) Int. Cl.$^7$ .................................................. G11C 8/00
(52) U.S. Cl. .............................. 365/230.01; 365/230.03; 365/230.06; 365/230.08; 711/200; 711/202; 711/217
(58) Field of Search .................... 365/189.01, 230.01, 365/230.03, 230.06, 230.08; 711/200, 202, 207

(56) References Cited

U.S. PATENT DOCUMENTS

| | | |
|---|---|---|
| 3,527,930 | * 9/1970 | Cocke et al. . |
| 3,917,935 | * 11/1975 | Lazecki ................................. 235/186 |
| 4,337,519 | * 6/1982 | Nishimoto ............................ 364/736 |
| 4,473,887 | * 9/1984 | Odaka .................................. 364/754 |
| 4,534,029 | 8/1985 | Singh et al. . |
| 4,603,397 | * 7/1986 | Ohsuki et al. ....................... 364/763 |
| 4,636,973 | * 1/1987 | Cantwell ............................. 364/764 |
| 4,952,823 | 8/1990 | Guo . |
| 5,245,576 | 9/1993 | Foss et al. . |
| 5,467,318 | 11/1995 | Motomura . |
| 5,583,806 | 12/1996 | Widigen et al. . |
| 5,625,582 | 4/1997 | Timko . |
| 5,659,495 | 8/1997 | Briggs . |
| 5,677,883 | 10/1997 | Miwa . |
| 5,754,819 | 5/1998 | Lynch et al. . |
| 5,815,420 | 9/1998 | Steiss . |
| 5,893,137 | 4/1999 | Parks et al. . |
| 5,953,745 | 9/1999 | Lattimore et al. . |

FOREIGN PATENT DOCUMENTS

| | | |
|---|---|---|
| 0 210 752 A2 | 2/1987 | (EP) . |
| 2 063 166 | 6/1981 | (GB) . |
| 2 077 190 | 12/1981 | (GB) . |

OTHER PUBLICATIONS

Lammers, David, " . . . While IBM Shows Path to GHz Processors," *Electronic Engineering Times*, p. 4, Feb. 9, 1998.

"Evaluation of A+B=K Conditions Without Carry Propagation", Jodi Cortadella and Jose M. Llaberia, IEEE Transaction on Computers, vol. 41, No. 11, Nov., 1991.

"The Half–Adder Form and Early Branch Conditions Resolution," David Lutz and D.N. Jayasimha.

"Early Zero Detection", David R.Lutz and D.N. Jayasimha.

* cited by examiner

Primary Examiner—Viet Q. Nguyen
(74) Attorney, Agent, or Firm—Kenyon & Kenyon

(57) ABSTRACT

The present invention provides a memory system that retrieves data based upon redundant form address data. The memory system includes a memory having a plurality of memory lines and an address decoder that enables one of the memory lines in response to a redundant form address signal. A redundant form decoder decodes redundant form data into a differential pair of decoded address lines for each bit position of a memory address. One of the two differential pairs carries correct address data. The one address line to be used is determined on a memory line by memory line basis, using the address of the memory lines themselves. The redundant form address decoder avoids a completion add that would otherwise be required, yielding very fast access to memory.

23 Claims, 10 Drawing Sheets

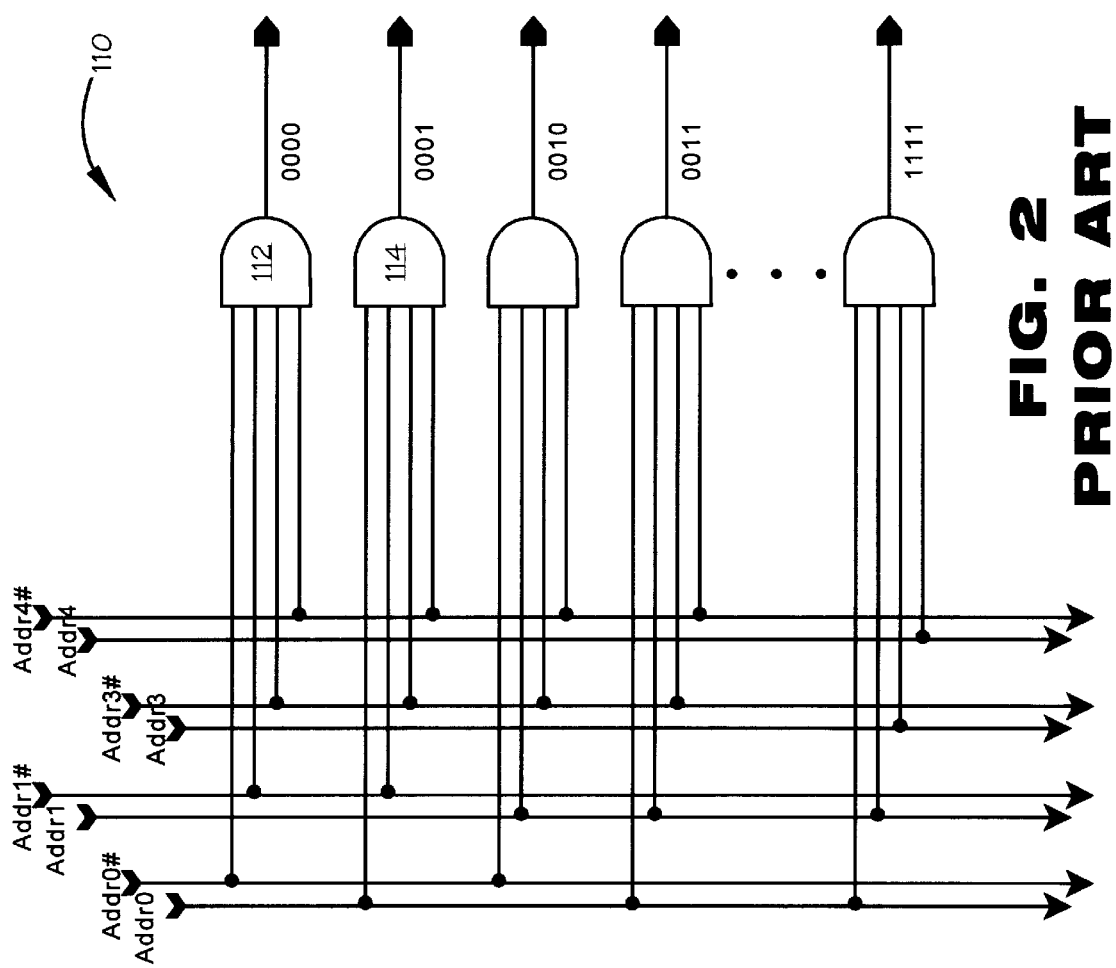

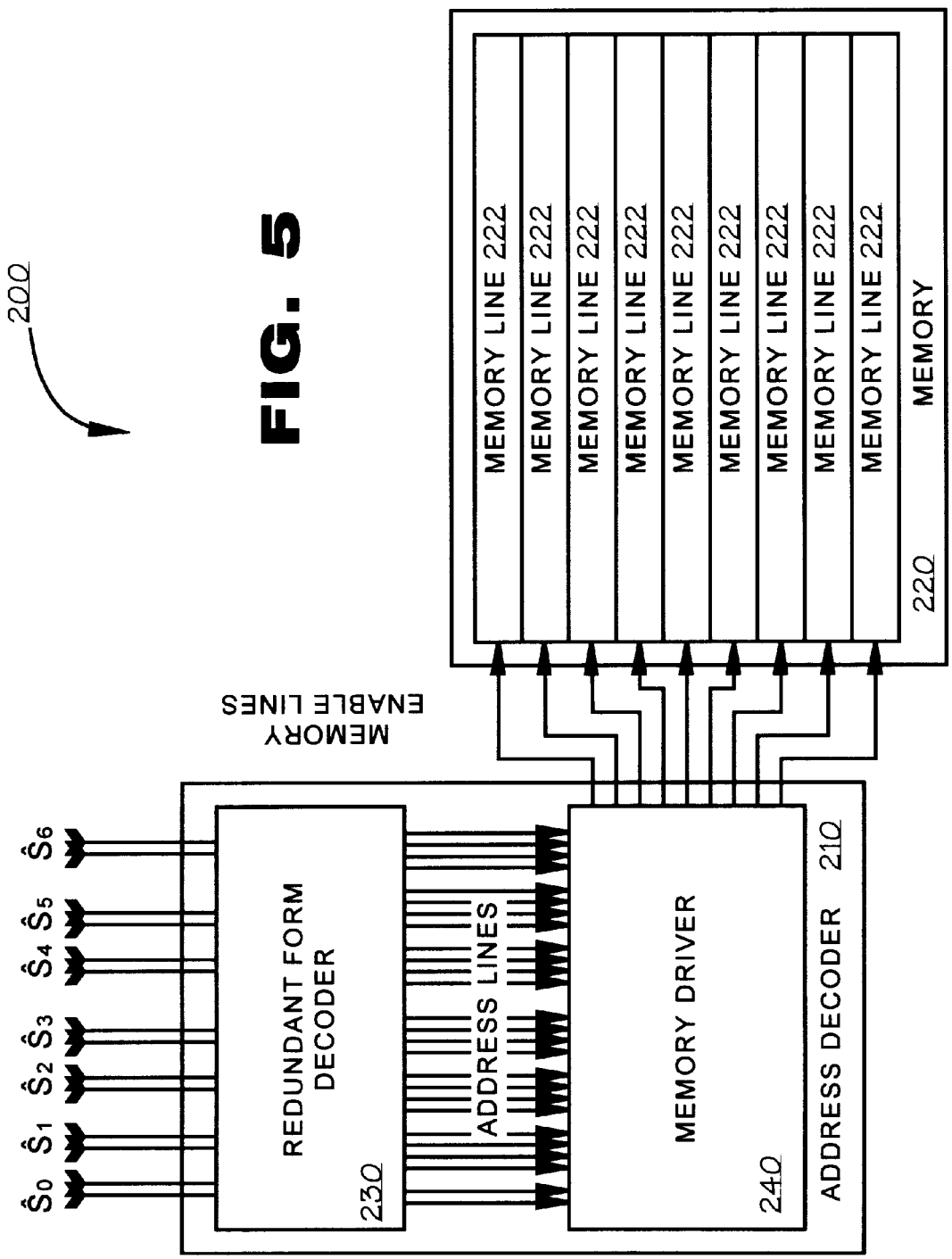

REDUNDANT FORM ADDRESS DECODER FOR MEMORY SYSTEM

BACKGROUND

The present invention relates to an address decoder for a memory.

Microprocessors and other integrated circuits store data in memory systems. The memory systems store digital data such as program instructions or variable data. Shown in FIG. 1, a typical memory system 100 includes an address decoder 110, a memory 120 and, optionally, a selection switch 130. The memory 120 is organized into rows, called "memory lines." Each memory line possesses a unique address. When an address is applied to the address decoder 110, the address decoder 110 causes data stored in the associated memory line to be output from the memory system 100.

In certain applications, it may be preferable to retrieve only part of a memory line. For example, a processor may load data into the memory 120 one memory line at a time but may use the loaded data in smaller increments. In this type of application, the selection switch 130 permits a selected portion of a memory line to be output from the memory system 100. An output to a common bus is applied to the selection switch. Thus, data from an enabled memory line is provided to the selection switch 130. The selection switch 130 selects a part of the memory line to be provided from the memory system 100.

To reference a desired portion of data in the form of signals, the address decoder 110 typically receives an address signal that identifies not only a requested memory line but also a portion of the memory line. The memory line is identified by a first part of the address ($Addr_s$-$Addr_n$); the portion of the memory line is identified by a second part of the address ($Addr_0$-$Addr_{s-1}$).

The address decoder 110 is shown in greater detail in FIG. 2. The address decoder 110 is populated by a plurality of AND gates, one per memory line in memory 120. Each AND gate, such as gate 112, receives an input signals for each bit position of the first part of the address ($Addr_s$-$Addr_n$). Also for each bit position i, the address signals $Addr_i$ are inverted ($Addr_i\#$) so that either the true value of the address bit or its complement may be applied to an AND gate. For any AND gate, the gate is coupled to the one of $Addr_i$ or $Addr_i\#$ that is a one when the appropriate address signal is applied.

For example, AND gate 112 should enable its memory line when address "0000" is applied to the address decoder. In response to "0000," $Addr_i=0$ for all i. However, $Addr_i\#=1$ for all i. Therefore AND gate 112 receives input signals from $Addr_0\#$, $Addr_1\#$, $Addr_2\#$, etc. Similarly, AND gate 114 should enable its memory line when address "0001" is applied to the address decoder. Therefore, $Addr_i\#$ is applied to AND gate 114 for all i≠0. For address "0001," $Addr_0=1$ and is applied to the AND gate 114 instead of $Addr_0\#$. Each AND gate is coupled to the address lines in accordance with the address to which the AND gate should be responsive.

It is a goal of memory systems to retrieve requested data as quickly as possible. Any delays that occur between the time that an address is posted and the time that the requested data is available for use are undesirable. At times, however, address data may be posted as one or more arithmetic operations. The arithmetic operations must be performed before an address may be applied to the address decoder 110. Traditional arithmetic operations are slow; they impose the undesired delay to data retrieval operations.

A traditional adder is shown in FIG. 3. There, four bit inputs X and Y are added together to obtain a four-bit sum S and a single bit carry $C_{out}$. The adder includes an internal carry chain that propagates between every bit position in the adder. A carry from a first bit position may affect the value of the sum at a second bit position ($S_2$). A carry from the second bit position may affect the value of the sum at a third bit position ($S_3$). The carry chain continues through to the most significant bit. Because the carries affect the value of the sum result, true results cannot be output from the adder until the carry chain has traversed the entire length of the adder.

When several arithmetic operations are performed sequentially, carry chains must be completed for each operation. Sequential arithmetic operations on address data cause memory operations to be very slow.

Accordingly, there is a need in the art for a memory system that provides for fast retrieval of requested data when data is subject to arithmetic operations.

"Redundant form" adders are known to be faster than traditional adders. An example of a three input redundant form adder is shown in FIG. 4. There, the adder generates a multi-bit sum, labeled "$\hat{S}$," from inputs W, X and Y. Each "bit position" in the resulting sum (such as $\hat{S}_2$) actually is represented by two bits. The redundant form adder does not possess the internal carry chain found in traditional adders. Accordingly, redundant form arithmetic operations are very fast relative to traditional arithmetic operations. To obtain a traditional, non-redundant result, the two bits at each bit position must be added together by a traditional adder. For example, the two bits of each sum position $\hat{S}_i$ output by the redundant form adder may be input to the traditional adder of FIG. 3 to obtain a non-redundant result.

Traditional memory cannot operate on address data that is input in redundant form. No known memory system performs address decoding on address data in redundant form.

SUMMARY

Embodiments of the present invention provide a memory system that retrieves data based upon redundant form address data. The memory system includes a memory having a plurality of memory lines and an address decoder that enables one of the memory lines in response to a redundant form address signal.

BRIEF DESCRIPTION OF THE DRAWINGS

FIG. 2 is a block diagram of a known address decoder for a memory system.

FIG. 5 is a block diagram of a memory system constructed in accordance with a first embodiment of the present invention.

DETAILED DESCRIPTION

Figure 1:
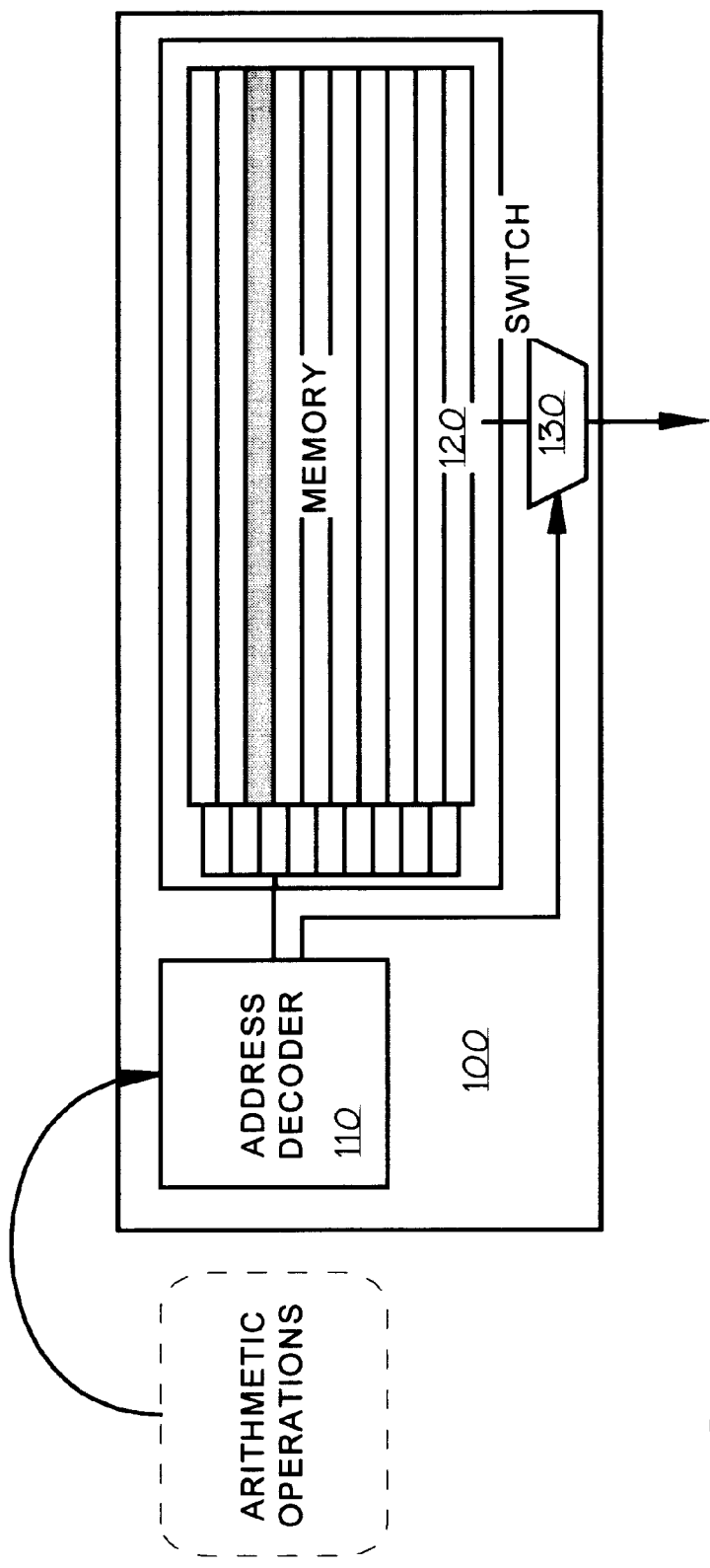
FIG. 1 is a block diagram of a known memory system.

An embodiment of the present invention provides a memory system that retrieves data based upon address information input signals in redundant form. When arithmetic operations are performed on address data signals, data retrieval from memory systems is made faster than data retrieval from traditional systems.

FIG. 5 illustrates a memory system 200 constructed in accordance with a first embodiment of the present invention. The memory system 200 includes an address decoder 210 and a memory 220. The address decoder 210 receives address data signals in redundant form; that is, two bits per "bit position" $\hat{S}_i$. Based on the value of the redundant form address data signals, the address decoder 210 accesses a selected memory line 222 in the memory 220. The memory 220 outputs data signals from the selected memory line 222.

The address decoder 210 may be a two-stage decoder in this embodiment. The first stage 230 comprises a redundant form decoder in which the redundant form address data signals are decoded into address signal lines in the embodiment. For all bit positions i (i≠0), the redundant form decoder 230 generates four address signals, labeled $Z_{ia}$, $Z_{ib}$, $Z_{ic}$ and $Z_{id}$, in differential pairs ($Z_{ia}=Z_{ib}\#$, $Z_{ic}=Z_{id}\#$). The redundant form decoder 230 is populated by a number of redundant form decoding circuits (not shown in FIG. 5). The second stage comprises a memory driver 240 in which the address decoder 210 generates memory enable signals based upon data signals on the address lines.

Figure 6:
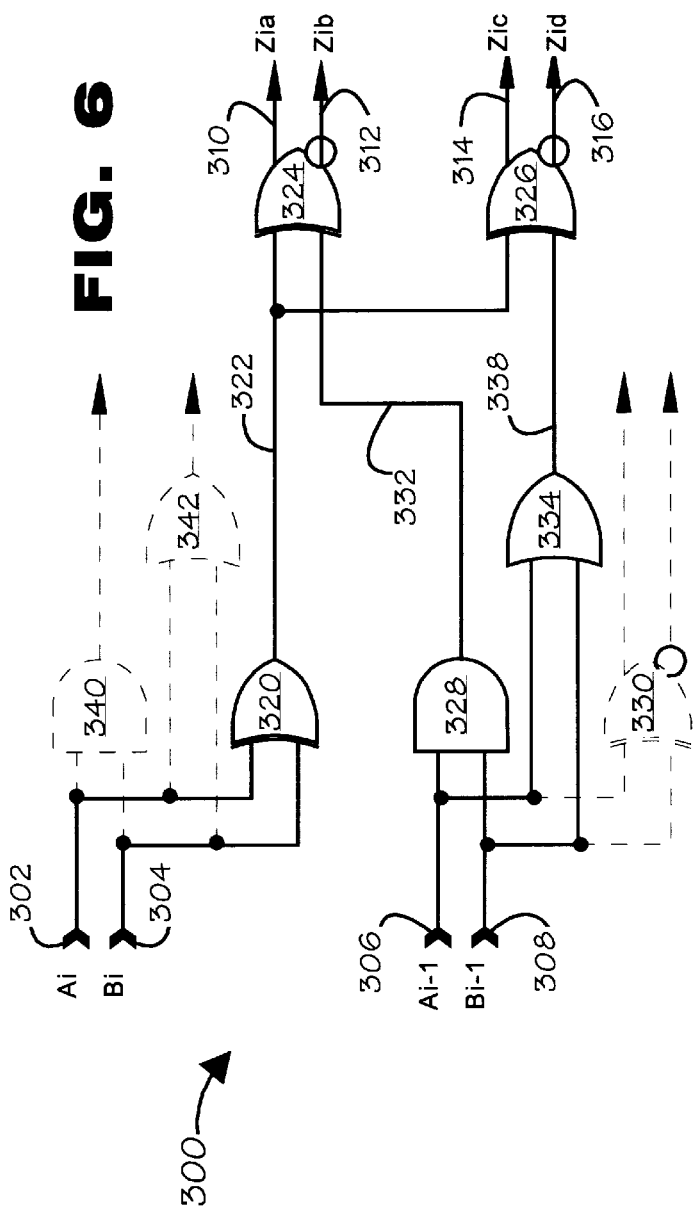
FIG. 6 is a block diagram of a single stage redundant form decoder circuit constructed in accordance with an embodiment of the present invention.

FIG. 6 illustrates a redundant form decoder circuit 300 for bit position $\hat{S}_i$ (i≠0) constructed in accordance with an embodiment of the present invention. For notational purposes, the two bits of $\hat{S}_i$ are labeled $A_i$ and $B_i$ respectively. The decoder circuit 300 generates address signals $Z_{ia}$, $Z_{ib}$, $Z_{ic}$ and $Z_{id}$ based upon the values of $\hat{S}_i$ ($A_i$, $B_i$) and $\hat{S}_{i-1}$ ($A_{i-1}$ and $B_{i-1}$). Signals $A_i$, $B_i$, $A_{i-1}$ and $B_{i-1}$ are input to the decoder 300 on input ports 302, 304, 306 and 308 respectively. Address signals $Z_{ia}$, $Z_{ib}$, $Z_{ic}$ and $Z_{id}$ are output from the decoder 300 on output ports 310, 312, 314 and 316 respectively.

$A_i$ and $B_i$ are input signals to a first XOR gate 320. XOR gate 320 generates an output signal on line 322. Line 322 is input to a pair of XOR gates 324 and 326. XOR gate 324 generates the first differential pair of address signals $Z_{ia}$ and $Z_{ib}$. XOR gate 326 generates the second differential pair of address signals $Z_{ic}$ and $Z_{id}$.

$A_{i-1}$ and $B_{i-1}$ are input to an AND gate 328 and to an OR gate 334. AND gate 328 generates an output signal on line 332 that is input to XOR gate 324. The OR gate 334 generates an output signals on line 338 that is input to XOR gate 326.

The redundant form decoder circuit 300 resembles a traditional adder to a great degree. Line 322 represents a non-redundant sum that would be obtained by adding $A_i$ to $B_i$. Lines 332 and 338 represent carries from position i−1 under appropriate circumstances:

The signal on line 332 represents the carry from position i−1 when $S_{i-1}$=1 (as described later).

The signal on line 338 represents the carry from position i−1 when $S_{i-1}$=0 (as described later).

Thus, either $Z_{ia}$ or $Z_{ic}$ represents the non-redundant sum bit $S_i$. Identification of the one address line that carries the correct value of $S_i$ is determined based on additional information. This is discussed in connection with FIG. 8 below.

A traditional adder, however, would employ an internal carry chain that propagates through every bit position of the addition. The redundant form decoder circuit 300 does not include any carry in from position i−2 in this embodiment.

The redundant form decoder circuit 300 may be but one stage of a multi-bit decoder. The gates shown in FIG. 6 may be shared with other stages to form a complete multi-bit decoder. For example, additional gates 340 and 342 (shown in phantom) illustrate gates that would be provided to couple input signals $A_i$ and $B_i$ to the i+1 position decoder. Gates 340 and 342 in the i+1$^{th}$ position decoder correspond to gates 328 and 334 in the i$^{th}$ position decoder. Gate 330 (also in phantom) may be used in an i−1 position decoder.

Figure 7:
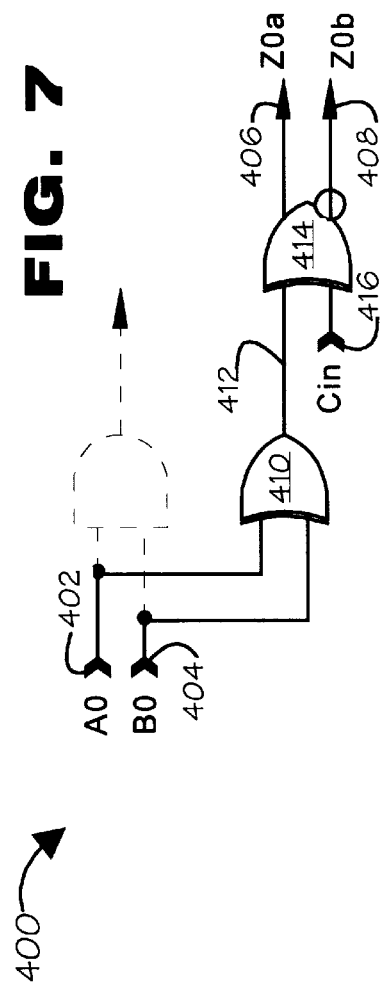
FIG. 7 is a block diagram of a single stage redundant form decoder circuit constructed in accordance with an embodiment of the present invention.

FIG. 7 illustrates a redundant form decoder circuit 400 constructed in accordance with an embodiment of the present invention. The decoder circuit 400 is appropriate for use with redundant form bit $\hat{S}_0$. Again, for notational purposes, the two bits of $\hat{S}_0$ are represented as $A_0$ and $B_0$ respectively. They are input to the decoder circuit 400 at input terminals 402 and 404. The decoder circuit 400 generates a single differential pair of address lines $Z_{0a}$ and $Z_{0b}$ on output terminals 406 and 408.

$A_0$ and $B_0$ are input to an XOR gate 410. XOR gate 410 generates an output signal on line 412. A carry in $C_{in}$, if provided for bit position 0, is input at input terminal 416. A second XOR gate 414 receives input signals from line 412 and terminal 416. The second XOR gate 416 generates $Z_{0a}$ and $Z_{0b}$ on output terminals 406 and 408. If no carry in $C_{in}$ is provided, the second XOR gate 414 may be omitted. $Z_{0a}$ and $Z_{0b}$ may be generated directly from the first XOR gate 410.

Figure 4:
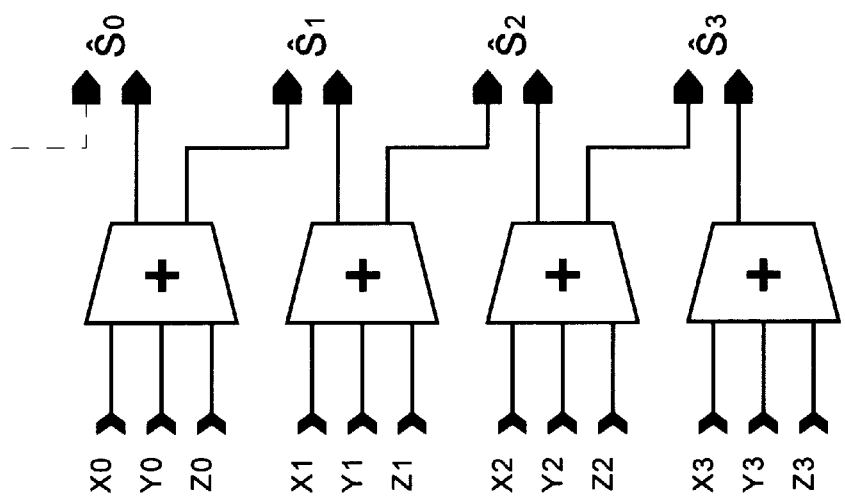
FIG. 4 is a block diagram of a known redundant form adder circuit.
Figure 3:
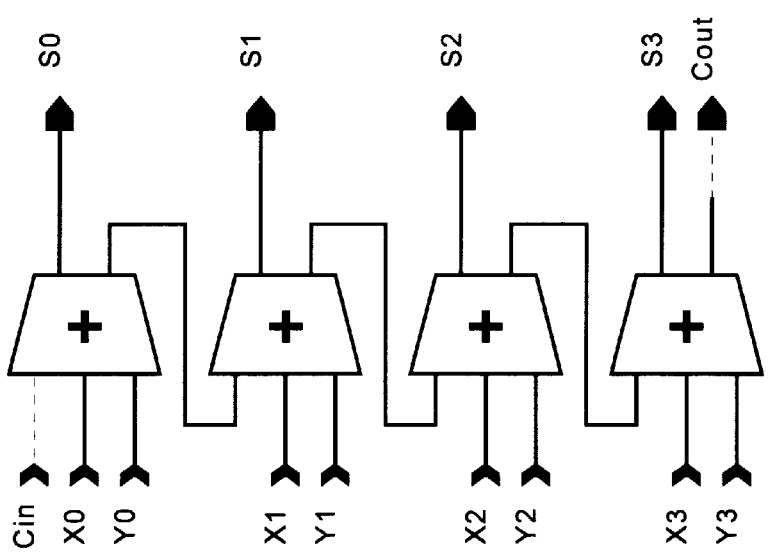
FIG. 3 is a block diagram of a traditional adder circuit.
Figure 8:
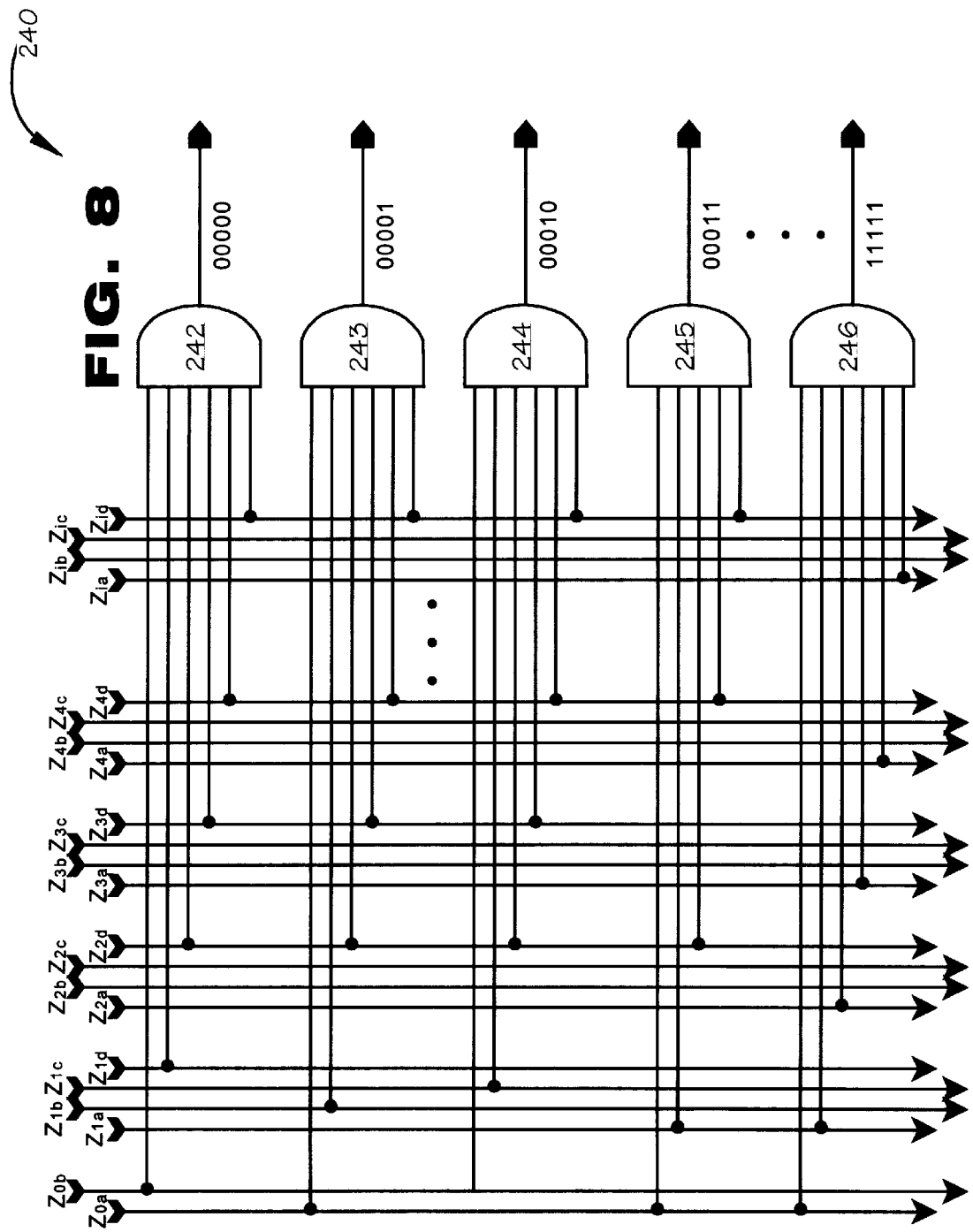
FIG. 8 is a block diagram of a memory driver of a redundant form address decoder constructed in accordance with an embodiment of the present invention.

FIG. 8 illustrates a circuit diagram of a memory driver 240 of the address decoder 210 (FIG. 5) constructed in accordance with an embodiment of the present invention. The memory driver 240 is populated by a number of AND gates 242–246. Each AND gate (such as gate 242) is provided in association with one of the memory lines in the memory 220 (FIG. 4). Each AND gate 242 receives one of the address lines $Z_{ia}$–$Z_{id}$ (i=1 to n) from the redundant form decoder 230 as an input. Each AND gate 242 also receives one of the pair of address lines $Z_{0a}$–$Z_{0b}$ for bit position i=0. In response to a redundant form input address signal, one of the memory lines 222 (FIG. 5) should be enabled.

As noted with respect to the redundant form decoder 300 of FIG. 6, one of address lines $Z_{ia}$ and $Z_{ic}$ carry the correct signal value of non-redundant $S_i$. The correct signal value could be determined from an internal carry chain typical to conventional adders (sometimes called the "completion add"). However, improved performance may be obtained by omitting the internal carry chain.

In this embodiment, each AND gate 242–246 maps to a memory line 222 (FIG. 5) having a unique address R. The address may be used as an additional piece of information to identify which of $Z_{ia}$ or $Z_{ic}$ carries the correct value of non-redundant $S_i$. Specifically, the non-redundant value of the address R at bit position i−1 ($R_{i-1}$) is taken to be the value of the non-redundant sum $S_{i-1}$ ($R_{i-1}=S_{i-1}$). This assumption is justified because, if it were not true, then some other input signal to the driving AND gate (say, 253) would be zero during the address decoding process. The AND gate 253 might not drive its associated memory line in such a circumstance. In other words, the AND gate 253 functions when the completion add would have generated a $S_{i-1}$ that agrees with the address bit $R_{i-1}$. When the input signal values $A_i$, $B_i$, $A_{i-1}$ and $B_{i-1}$ are known and the non-redundant sum $S_{i-1}$ is "known" to be $R_{i-1}$, the non-redundant value $S_i$ may be calculated.

Table 1 below illustrates the values of $S_i$ and the values $Z_{ia}$–$Z_{id}$ output from the redundant form decoding circuit 300 for all possible permutations of $A_i$, $B_i$, $A_{i-1}$, $B_{i-1}$ and $S_{i-1}$. The table is sorted first by $S_{i-1}$, then by $S_i$. As the table illustrates, when $S_{i-1}$ is 0, $Z_{ic}=S_i$. When $S_{i-1}$ is 1, $Z_{ia}=S_i$.

TABLE 1

| $A_i$ | $B_i$ | $A_{i-1}$ | $B_{i-1}$ | $S_{i-1}$ | $S_i$ | $Z_{ia}$ | $Z_{ib}$ | $Z_{ic}$ | $Z_{id}$ | $A_i$ | $B_i$ | $A_{i-1}$ | $B_{i-1}$ | $S_{i-1}$ | $S_i$ | $Z_{ia}$ | $Z_{ib}$ | $Z_{ic}$ | $Z_{id}$ |
|---|---|---|---|---|---|---|---|---|---|---|---|---|---|---|---|---|---|---|---|
| 0 | 0 | 0 | 0 | 0 | 0 | 0 | 1 | 0 | 1 | 0 | 0 | 0 | 0 | 1 | 0 | 0 | 1 | 0 | 1 |
| 0 | 1 | 0 | 1 | 0 | 0 | 1 | 0 | 0 | 1 | 0 | 0 | 0 | 1 | 1 | 0 | 0 | 1 | 1 | 0 |
| 0 | 1 | 1 | 0 | 0 | 0 | 1 | 0 | 0 | 1 | 0 | 0 | 1 | 0 | 1 | 0 | 0 | 1 | 1 | 0 |
| 0 | 1 | 1 | 1 | 0 | 0 | 1 | 0 | 0 | 1 | 0 | 1 | 1 | 1 | 1 | 0 | 0 | 1 | 0 | 1 |
| 1 | 0 | 0 | 1 | 0 | 0 | 1 | 0 | 0 | 1 | 1 | 0 | 1 | 1 | 1 | 0 | 0 | 1 | 0 | 1 |
| 1 | 0 | 1 | 0 | 0 | 0 | 1 | 0 | 0 | 1 | 1 | 1 | 0 | 0 | 1 | 0 | 0 | 1 | 0 | 1 |
| 1 | 0 | 1 | 1 | 0 | 0 | 1 | 0 | 0 | 1 | 1 | 1 | 0 | 1 | 1 | 0 | 0 | 1 | 1 | 0 |
| 1 | 1 | 0 | 0 | 0 | 0 | 1 | 0 | 0 | 1 | 1 | 1 | 1 | 0 | 1 | 0 | 0 | 1 | 1 | 0 |
| 0 | 0 | 0 | 1 | 0 | 1 | 0 | 1 | 1 | 0 | 0 | 0 | 1 | 1 | 1 | 1 | 1 | 0 | 1 | 0 |
| 0 | 0 | 1 | 0 | 0 | 1 | 0 | 1 | 1 | 0 | 0 | 1 | 0 | 0 | 1 | 1 | 1 | 0 | 1 | 0 |
| 0 | 0 | 1 | 1 | 0 | 1 | 1 | 0 | 1 | 0 | 0 | 1 | 0 | 1 | 1 | 1 | 1 | 0 | 0 | 1 |
| 0 | 1 | 0 | 0 | 0 | 1 | 1 | 0 | 1 | 0 | 0 | 1 | 1 | 0 | 1 | 1 | 1 | 0 | 0 | 1 |
| 1 | 0 | 0 | 0 | 0 | 1 | 1 | 0 | 1 | 0 | 1 | 0 | 0 | 0 | 1 | 1 | 1 | 0 | 1 | 0 |
| 1 | 1 | 0 | 1 | 0 | 1 | 0 | 1 | 1 | 0 | 1 | 0 | 0 | 1 | 1 | 1 | 1 | 0 | 0 | 1 |
| 1 | 1 | 1 | 0 | 0 | 1 | 0 | 1 | 1 | 0 | 1 | 0 | 1 | 0 | 1 | 1 | 1 | 0 | 0 | 1 |
| 1 | 1 | 1 | 1 | 0 | 1 | 1 | 0 | 1 | 0 | 1 | 1 | 1 | 1 | 1 | 1 | 1 | 0 | 1 | 0 |

Of course, an AND gate 253 is responsive only when it receives input signals that are 1. However, sometimes the correct value of $S_i$ is 0 (when $R_i=0$). If $S_i$ were input to the AND gate 253, it would not function even though the selected value of $S_i$ is correct. Thus, when the correct value of $S_i$ is selected but $S_i=0$, $S_i$ is inverted and input to the AND gate 253. Because $Z_{ib}=Z_{ia}\#$ and $Z_{id}=Z_{ic}\#$, they are used as input signals when $S_i=0$.

Thus, for each bit position i (i≠0), an AND gate is coupled to one of the four address lines $Z_{ia}$–$Z_{id}$ based upon the non-redundant values of the address bits $R_i$, $R_{i-1}$. Table 2 demonstrates how the connections are made:

TABLE 2

| Value of Address for AND Gate | | Selected |
|---|---|---|
| $R_i$ | $R_{i-1}$ | Address Line |
| 0 | 0 | $Z_{id}$ |
| 0 | 1 | $Z_{ib}$ |
| 1 | 0 | $Z_{ic}$ |
| 1 | 1 | $Z_{ia}$ |

In FIG. 8 the AND gates 252–255 illustrate couplings made in accordance with this principle for i=1.

As described with reference to FIG. 5, bit position i=0 is used to address a memory line 222. For each AND gate related to an address R terminating in 0 ($R_0=0$), the AND gate receives an input from line $Z_{0b}$ in this embodiment. For each AND gate related to an address terminating in 1 ($R_0=1$), the AND gate receives an input signals from line $Z_{0a}$ in this embodiment.

When the least significant bit of the redundant form input data signals is used in the address of the memory lines 222, the present invention may be used without a completion add. However, a completion add may be employed when the least significant bit of the redundant form data does not coincide with the least significant bit of the address of the memory line. For example, if redundant form input data extends from $\hat{S}_0$-$\hat{S}_n$ but only bits $\hat{S}_3$-$\hat{S}_n$ address the memory lines, a completion add may be employed for redundant form bits $\hat{S}_0$-$\hat{S}_3$.

Figure 9:
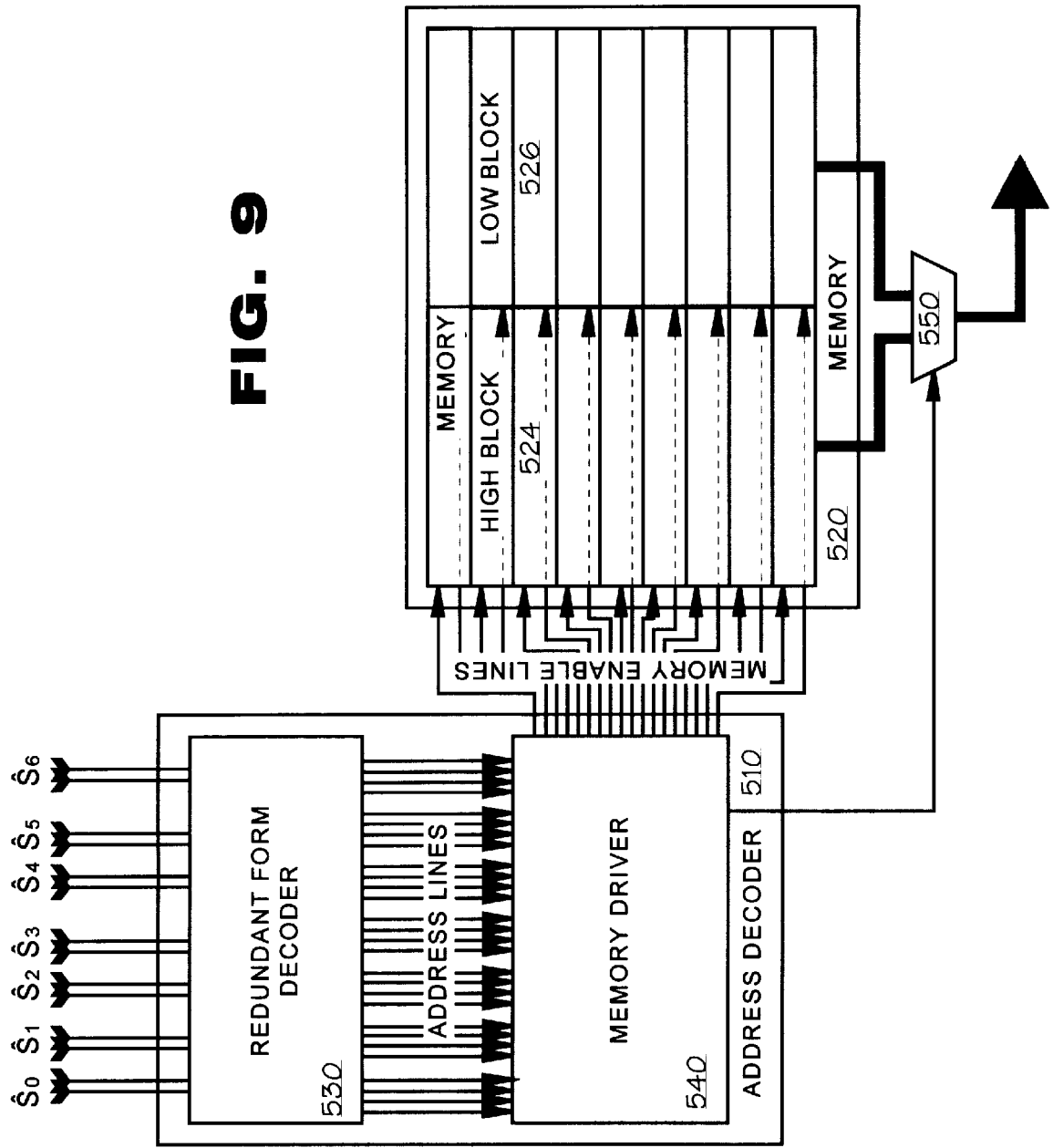
FIG. 9 is a block diagram of a memory system constructed in accordance with a second embodiment of the present invention.

FIG. 9 illustrates a memory system 500 constructed in accordance with a second embodiment of the present invention. In the second embodiment, aligned data signals may be read out of a memory based on redundant form address data signals. The memory system 500, like the system 200 of FIG. 5, includes an address decoder 510 and a memory 520.

The address decoder 510 comprises a two-stage decoder including a redundant form decoder 530 and a memory driver 540. The memory system 500 also includes a selection switch 550.

In the second embodiment, of the redundant form address bits $\hat{S}_0$-$\hat{S}_{s+n}$ subject to arithmetic preprocessing, only a portion of the bits $\hat{S}_s$-$\hat{S}_{s+n}$ is employed to address individual memory lines. The remaining bits, $\hat{S}_0$-$\hat{S}_{s-1}$ represent data signals within a memory line.

The memory system 500 of FIG. 9 reads out "aligned data." Aligned data comprises data signals that are contained within a predefined block in a memory line. Each memory line 522 is divided into a plurality of blocks. Two blocks are shown in FIG. 9: High order blocks 524 and low order blocks 526. Within a memory line 522, the blocks are identified by address data $S_{s-1}$ at position s-1. In this embodiment, requested data does not cross a boundary between blocks.

The redundant form decoder 530 is populated by multiple stages of the redundant form decoder circuit 300 of FIG. 6. The redundant form decoder circuit 300 is appropriate for decoding all redundant sum bits $\hat{S}_i$ for i=s to s+n.

Figure 10:
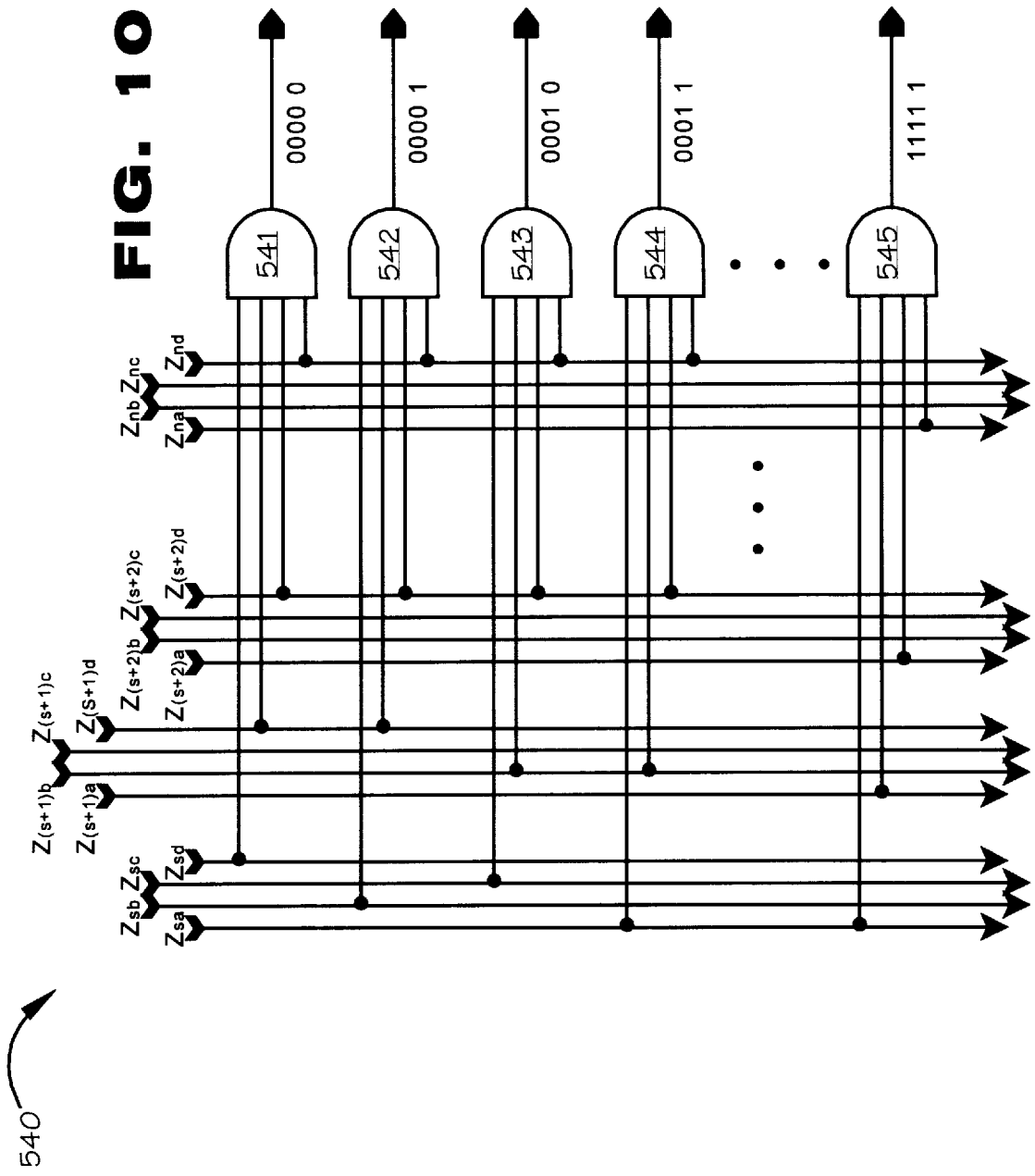
FIG. 10 is a block diagram of a memory driver constructed in accordance with a second embodiment of the present invention.

FIG. 10 illustrates a memory driver 540 of the address decoder 510 constructed in accordance with an embodiment of the present invention. The memory driver is populated by a number of AND gates 541–545 each associated with a block of a memory line. In the memory driver 540 of FIG. 9 there are twice as many AND gates 541–545 as there are memory lines. Where a memory line 522 is assigned an address R composed of bits $R_s$ to $R_{s+n}$, the blocks within each memory line are addressed by lower order bits $R_{s-1}$ to $R_{s-m}$. In the two-block example of FIG. 9, bit $R_{s-1}$ addresses the blocks within a memory line.

For each bit position i (i from s to s+n), each AND gate 541–545 receives as an input signal of the address lines $Z_{ia}$, $Z_{ib}$, $Z_{ic}$ or $Z_{id}$ generated by the redundant form address decoder 530. Identification of the one address line $Z_{ia}$–$Z_{id}$ to which an AND is coupled is determined by the AND gates' address bit $R_i$ and $R_{i-1}$ according to the principle outlined in Table 2 above.

In the memory driver 540 of FIG. 10, two AND gates 541, 542 are responsive to a predetermined redundant form address. A first AND gate 541 selects a low order block 526. The selected low order block 526 is addressed correctly when $S_{s-1}=0$. A second AND gate 542 selects a high order block 524. The selected high order block is addressed correctly when $S_{s-1}=1$. The selection switch 550 (FIG. 9) determines which selected block of data is routed out of the memory system 500.

The requested block of data is selected by selection switch 550 based on non-redundant $S_{s-1}$. Initially, $S_{s-1}$ is not known. To obtain $S_{s-1}$, it may be desirable to perform a traditional add of the redundant form address data $\hat{S}$ for bit positions 0 through s–1. When a non-redundant value of $S_{s-1}$ is obtained, it is applied to the selection switch 550 to select the correct block of data. The block selected by the selection switch 550 is the one whose decoding AND gate is known to have received a correct input signal.

Although a completion carry addition may be performed in the embodiment of FIG. 9, this embodiment still achieves improved performance over the systems of the prior art. The carry chain propagates only through bits 0 through s–1, not through the entire length of the address (0 though s+n). Thus, the carry chain is reduced.

The time employed to perform the short completion add may be justified also due to operational characteristics of a memory. Traditionally, memories are somewhat slow to output data from a memory line once the memory line is enabled. There is an inherent latency in the time that data is available to a selection switch once a memory line is enabled. Thus, performing a traditional add on a short run of address data, for example, from bits 0 to s–1, does not impair significantly the speed at which data may be retrieved from the memory.

Alternatively, control signals input to the selection switch 550 may be generated using the logic of FIG. 9. The selection switch 550 itself may be controlled by redundant form logic.

Figure 11:
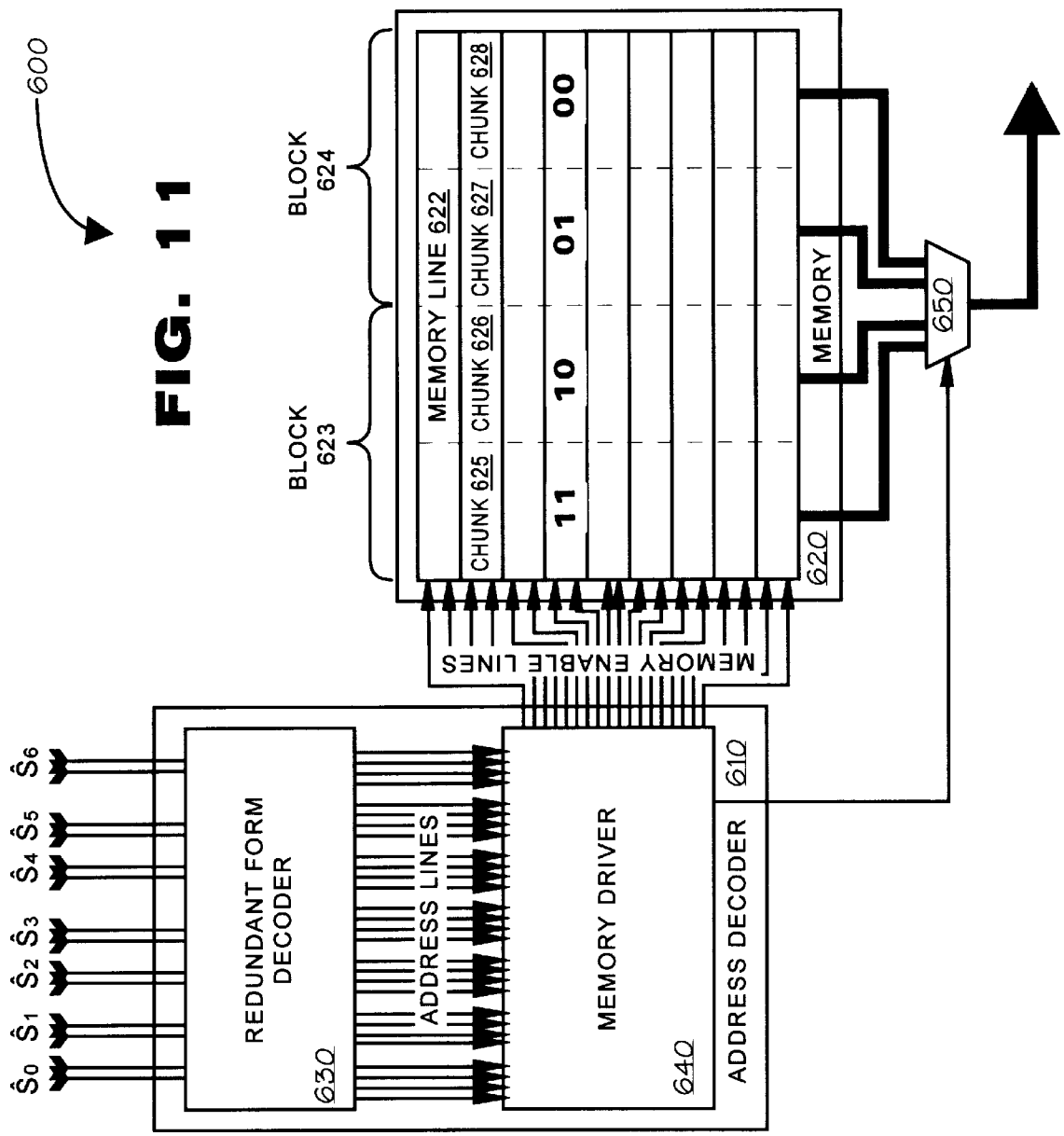
FIG. 11 is block diagram of a memory system constructed in accordance with a third embodiment of the present invention.

FIG. 11 illustrates a memory system 600 constructed in accordance with another embodiment of the present invention. The memory system 600 stores "unaligned" data, data that is not confined to either a high block or low block of the memory. Requested data may span from one quarter to one half of a memory line 622. As with the previous embodiments, the memory system 600 includes an address decoder 610 and a memory 620. The address decoder 610 includes a redundant form decoder 630 and a memory driver 640. The redundant form decoder 630 decodes redundant form address input into a plurality of decoded address lines, output as differential pairs. The memory driver 640 generates enable signals on memory enable lines.

The memory 620 is populated by a plurality of memory lines 622. Each memory line 622 is divided into a high order block 623 and a low order block 624. An independent memory enable line from the memory driver 640 drives each block 623, 624. Thus, in this embodiment, there may be twice as many memory enable lines as memory lines 622.

As noted with respect to the aligned data embodiment of FIG. 8, the memory driver 540 drives two blocks in the memory 520 in response to a single address input. A first block (say, a high order block 524) contains the requested data. A second block (a low order block 526) does not contain requested data. The two blocks may be, but are not necessarily, located in the same memory line 522. In the aligned embodiment of FIG. 8, because requested data is confined to one of the two blocks, it is immaterial whether the second block is addressed correctly or not. Data output by the second block is input to selection switch 550 but is not output from the memory system 500. The selection switch 550 outputs only the data from the first block. However, in the unaligned embodiment of FIG. 11, requested data may span a block boundary.

In the embodiment of FIG. 11, each memory line is divided into four data "chunks" 625–628. Each chunk is addressed by a composite address R including the address of the chunk's memory line 622 (represented by address bits $R_s$-$R_{s+n}$) and a two-bit address representing the chunk itself (represented by address bits $R_{s-2}$-$R_{s-1}$). Requested data may cross boundaries between chunks, but only one boundary. If requested data spans two chunks (say, chunks 625 and 626), the input address data references the lower of the two chunks. Accordingly, based upon an input address R, requested data will be found in the chunk (say, chunk 625) identified by the address and, at most, a chunk (626) adjacent to the address.

The address decoder 630 is a multi-bit decoder, populated by a number of decoder stages (not shown in FIG. 11). It receives an input address R (including bits $R_{s-2}$-$R_{s+n}$) and outputs decoded address signals ($Z_{ia}$–$Z_{id}$) for bit positions i=s to s+n. The redundant form decoder circuit 300 (FIG. 6) is appropriate for all bit positions i≠s.

Figure 12:
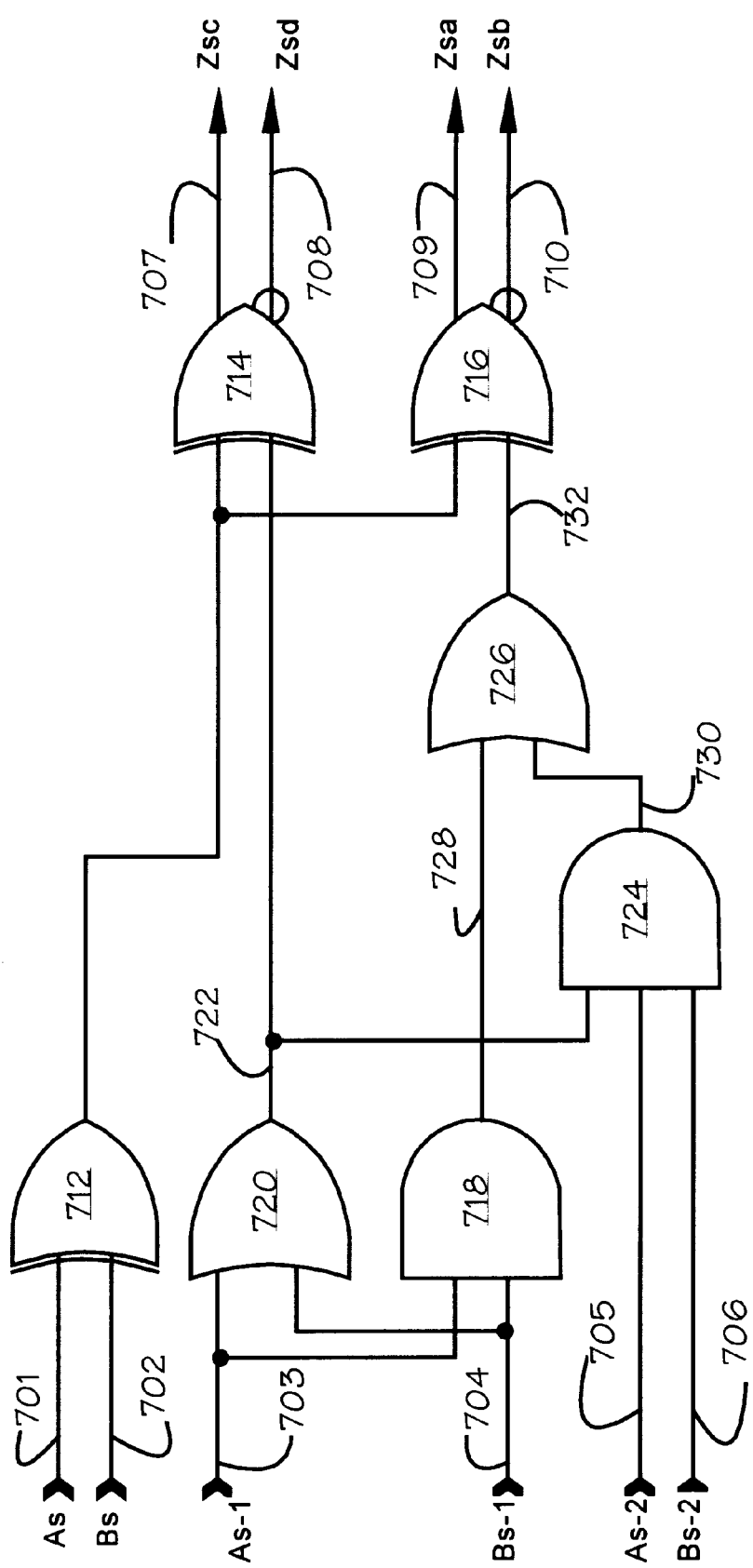
FIG. 12 is a block diagram of a single stage redundant form decoder circuit constructed in accordance with an embodiment of the present invention.

FIG. 12 illustrates a decoder circuit 700 constructed in accordance with an embodiment of the present invention. It is appropriate for decoding address signals for bit position i=s. The decoder circuit 700 generates two differential pairs of address signals $Z_{sa}$–$Z_{sd}$ based upon redundant form input data signals $\hat{S}_s$-$\hat{S}_{s-2}$. Redundant form address data signals $A_s$, $B_s$, $A_{s-1}$, $B_{s-1}$, $A_{s-2}$ and $B_{s-2}$ are input to the redundant form decoder circuit 700 at input terminals 701–706 respectively. The decoder circuit 700 outputs decoded address signals $Z_{sa}$–$Z_{sd}$ on output lines 707–710 respectively. Address data signals $A_s$ and $B_s$ are input to an XOR gate 712. An output signal from XOR gate 712 is input further to XOR gates 714 and 716. XOR gate 716 generates signals $Z_{sa}$ and $Z_{sb}$; XOR gate 714 generates signals $Z_{sc}$ and $Z_{sd}$.

Address data signals $A_{s-1}$ and $B_{s-1}$ are input to an AND gate 718 and also to an OR gate 720. An output signal (line 722) of the OR gate 720 is input to XOR gate 714. Address data signals $A_{s-2}$ and $B_{s-2}$ are input to another AND gate 724. An output signal on line 722 is input to AND gate 724 as well. An output signal from AND gate 724 (on line 730) and an output signal from AND gate 718 (on line 728) each are input to OR gate 726. An output of OR gate 726 (on line 732) is input to XOR gate 716.

The decoder circuit 700 ensures that when the redundant form input data in addresses chunk 627, the memory driver 640 drives both blocks 623 and 624 of the same memory line. Note that when the input address data references chunk 628, requested data must be found entirely within the low block 624. When the input address data references chunks 626 or 625 the requested data must be found entirely within the high block 623.

In an embodiment, the memory driver 640 may be constructed as shown in FIG. 10. For all bit positions, an AND gate is connected to one of the address lines $Z_{ia}$–$Z_{id}$, based upon the value of the AND gate's address R at positions $R_i$ and $R_{i-1}$ (see, Table 2). The selection switch is controlled based upon the non-redundant address at bits s–1 and s–2

The discussion of the redundant form address data provided above has assumed that one or a series of redundant form arithmetic operations are performed on address data before resultant address data is input to an address decoder. In a special case, arithmetic processing may be omitted from a memory operation. When a memory operation causes a single addition of two non-redundant addresses to be performed, the memory operation may be omitted. Instead, the two non-redundant addresses may be input directly to the address decoding.

Figure 13:
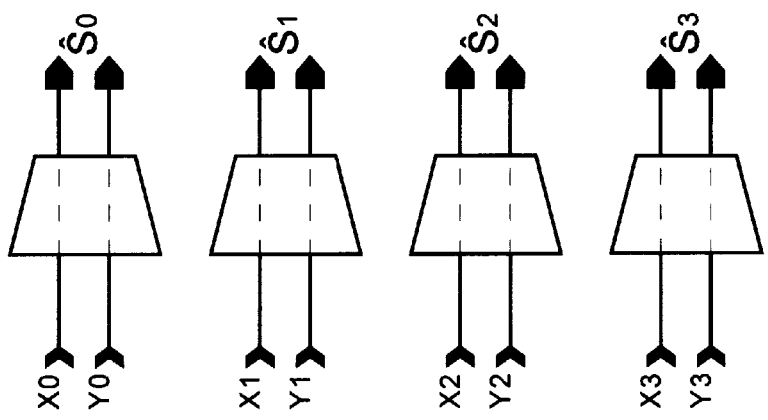
FIG. 13 is a block diagram illustrating how addition of two non-redundant values to obtain a result in redundant form employing no addition.

As shown in FIG. 13, a redundant form addition of two non-redundant numbers, generates a redundant form sum $\hat{S}$, where:

$$\hat{S}_i = A_i, B_i, \text{ for all } i.$$

Thus, this embodiment of the present invention provides for zero delay decoding of address data in a single addition implementation.

The present invention provides an address decoder that decodes address data in redundant form. The address decoder permits arithmetic operations to be made on address data at very high speed and, therefore, reduces latency of memory operations that rely on those arithmetic operations. Because the address decoder omits the internal carry chain common to traditional adders, it provides dramatic performance benefits over conventional memory operations involving arithmetic operations.

Several embodiments of the present invention are specifically illustrated and described herein. However, it will be appreciated that modifications and variations of the present invention are covered by the above teachings and within the purview of the appended claims without departing from the spirit and intended scope of the invention.

We claim:

1. A memory system, comprising:
   an address decoder adapted to receive redundant form address signals,
   a memory populated by memory lines, each memory line organized into first and second blocks, the blocks coupled to the address decoder by enable lines.

2. The system of claim 1, wherein the memory stores unaligned data.

3. The system of claim 1, wherein the address decoder comprises a plurality of redundant form decoder stages, at least one of the stages having inputs for redundant form address signals of three bit positions and having an output for a decoded address signal of one of the bit positions.

4. The memory system of claim 2, wherein at least one stage has inputs for redundant form address signals at two bit positions and has an output of decoded address data for one of the bit positions.

5. The memory system of claim 1, wherein the memory lines are organized into chunks, two to a block.

6. The memory system of claim 5, wherein each chunk is associated with a composite address.

7. The memory system of claim 1, further comprising a selection switch coupled to the memory lines.

8. The memory system of claim 1, wherein the address decoder comprises:
   a redundant form decoder having an input for the redundant form address signals, and
   a memory driver coupled to the redundant form decoder by decoded address lines and having an output coupled to the enable lines.

9. The memory system of claim 8, wherein the redundant form decoder is a multi-stage decoder.

10. A memory system, comprising:
    a memory populated by a plurality of memory lines organized into first and second blocks, each memory line associated with an address of a predetermined width,
    an address decoder having an input for redundant form address signals, the address signals representing address data of data within the memory, the address decoder coupled to the memory by enable lines.

11. The memory system of claim 10, wherein the redundant form address signals includes a redundant form data for every bit position of the memory address and for two bit positions adjacent to a least significant bit position of the memory address.

12. The memory system of claim 10, wherein the redundant form address signals includes a redundant form data for every bit position of the memory address and for two bit positions adjacent to a least significant bit position of the memory address.

13. The memory system of claim 10, wherein the address decoder comprising:
    a redundant form decoder coupled to the inputs, and
    a memory driver coupled to the redundant form decoder by decoded address lines and coupled to the enable lines.

14. The memory system of claim 13, wherein the redundant form decoder is a multi-stage decoder.

15. The memory system of claim 14, wherein the redundant form decoder includes a stage for each bit position of the memory address.

16. The memory system of claim 14, wherein at least one stage derives decoded address data for a bit position of the memory address from redundant form address data at the same bit position as the bit position of the memory address and an adjacent lower bit position.

17. The memory system of claim 14, wherein at least one stage derives address data for a bit position of the memory address from redundant form.

18. The memory system of claim 14, wherein a stage outputs decoded address lines associated with a bit position of the memory address.

19. The memory system of claim 18, wherein the stage outputs a pair of decoded address lines, one representing a non-redundant sum when a carry in the stage is zero, the other representing a non-redundant sum when the carry in is one.

20. A method of accessing data in a memory, the memory populated by memory lines each organized into first and second blocks, each memory line associated with an address of a predetermined width, the method comprising:
    receiving redundant form address data for each bit position of the memory address and at least two bit positions below a least significant bit position of the memory address,
    decoding the redundant for address data, and
    driving a first block and a second block based on the decoded address data.

21. The method of claim 20, further comprising outputting data from one of the driven first or second blocks based on redundant form address data at said two bit positions below a least significant bit position of the memory address.

22. The method of claim 20, wherein the memory lines are organized into chunks within the blocks, and the redundant form address data at the two bit positions represent an addressed chunk.

23. The method of claim 22, wherein when the addressed chunk indicates that requested data may be located in both blocks of a single memory line, the driving step drives the first and second block of the single memory line.

* * * * *